(12) United States Patent
Vieira De Morais et al.

(10) Patent No.: US 9,611,803 B2
(45) Date of Patent: Apr. 4, 2017

(54) ENGINE PISTON AND A PROCESS FOR MAKING AN ENGINE PISTON

(71) Applicants: Mahle Metal Leve S/A, Jundai-Sp (BR); Mahle International GmbH, Stuttgart (DE)

(72) Inventors: Paulo R. Vieira De Morais, São Bernardo do Campo (BR); Antonio E. Meirelles Tomanik, São Paulo (BR); Denys Flores, São Paulo (BR)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 143 days.

(21) Appl. No.: 14/427,307

(22) PCT Filed: Sep. 11, 2013

(86) PCT No.: PCT/BR2013/000353
§ 371 (c)(1),
(2) Date: Mar. 10, 2015

(87) PCT Pub. No.: WO2014/040156
PCT Pub. Date: Mar. 20, 2014

(65) Prior Publication Data
US 2015/0226150 A1 Aug. 13, 2015

(30) Foreign Application Priority Data
Sep. 11, 2012 (BR) .................................. 120229412

(51) Int. Cl.
*F02F 3/10* (2006.01)
*F02F 3/00* (2006.01)
(Continued)

(52) U.S. Cl.
CPC .............. *F02F 3/0084* (2013.01); *B05D 3/12* (2013.01); *B23K 20/1275* (2013.01);
(Continued)

(58) Field of Classification Search
CPC ...... F02F 3/0084; F02F 3/14; B23K 20/1275; B23K 20/2333; B23K 20/24;
(Continued)

(56) References Cited

U.S. PATENT DOCUMENTS 3,358,349 A * 12/1967 Rosen .................... B23K 20/08
228/107
5,477,820 A * 12/1995 Rao .......................... F02B 77/11
123/193.2
(Continued)

FOREIGN PATENT DOCUMENTS

DE 19901770 A1 7/1999
EP 0460901 A2 12/1991
(Continued)

OTHER PUBLICATIONS

First Office Action in Chinese for Chinese Patent Application No. 201380046269.7 dated May 11, 2016.
(Continued)

*Primary Examiner* — Marguerite McMahon
(74) *Attorney, Agent, or Firm* — Fishman Stewart PLLC

(57) ABSTRACT

A piston for an internal combustion engine may include a substantially circular body composed of an aluminum containing base material defining a top portion having at least one cavity. At least one coating layer may be disposed on at least one area defined by at least one of the top portion and the at least one cavity. The at least one coating layer may include at least one chemical compound derived from a chemical reaction between the base material of the body and the at least one coating layer in response to friction generated by a dragging movement of a non-consumable rotary pin with the at least one coating layer.

20 Claims, 1 Drawing Sheet

(51) Int. Cl.

| | |
|---|---|
| *B23K 20/12* | (2006.01) |
| *B23K 20/233* | (2006.01) |
| *B23K 20/24* | (2006.01) |
| *F02F 3/14* | (2006.01) |
| *B05D 3/12* | (2006.01) |
| *C23C 4/18* | (2006.01) |
| *C23C 8/80* | (2006.01) |
| *C23C 16/56* | (2006.01) |
| *C23C 22/82* | (2006.01) |
| *C23C 26/00* | (2006.01) |
| *C23C 30/00* | (2006.01) |
| *C25D 5/48* | (2006.01) |
| *C25D 7/00* | (2006.01) |
| *C25D 13/12* | (2006.01) |
| *F02F 3/12* | (2006.01) |
| *B23K 101/00* | (2006.01) |
| *B23K 103/10* | (2006.01) |

(52) U.S. Cl.
CPC .......... *B23K 20/2333* (2013.01); *B23K 20/24* (2013.01); *C23C 4/18* (2013.01); *C23C 8/80* (2013.01); *C23C 16/56* (2013.01); *C23C 22/82* (2013.01); *C23C 26/00* (2013.01); *C23C 30/005* (2013.01); *C25D 5/48* (2013.01); *C25D 7/00* (2013.01); *C25D 13/12* (2013.01); *F02F 3/10* (2013.01); *F02F 3/12* (2013.01); *F02F 3/14* (2013.01); *B23K 2201/003* (2013.01); *B23K 2201/006* (2013.01); *B23K 2203/10* (2013.01); *F05C 2253/12* (2013.01)

(58) Field of Classification Search
CPC ........ B23K 2201/003; B23K 2201/006; B23K 2203/10; B05D 3/12; C23C 4/18; C23C 8/80; C23C 16/56; C23C 22/82; C23C 26/00; C23C 30/005; C25D 5/48
USPC .......................... 123/193.6, 668; 29/888.048
See application file for complete search history.

(56) References Cited

U.S. PATENT DOCUMENTS

| | | | |
|---|---|---|---|
| 7,559,306 B2 * | 7/2009 | Kuroda | C09D 163/00 123/193.6 |
| 2008/0022962 A1 * | 1/2008 | Fujiwara | F02F 3/10 123/193.6 |
| 2012/0085328 A1 * | 4/2012 | Bachmann | C23C 14/165 123/668 |
| 2013/0042845 A1 * | 2/2013 | Kennedy | C23C 16/0272 123/668 |

FOREIGN PATENT DOCUMENTS

| | | |
|---|---|---|
| EP | 0843024 A1 | 5/1998 |
| EP | 2025776 A1 | 2/2009 |
| GB | 2367027 A | 3/2002 |
| JP | 2007-064129 A | 3/2007 |
| WO | WO-2008/131273 A1 | 10/2008 |

OTHER PUBLICATIONS

Ma, Hong-Yu: "Progress in Studies on Tribology of Metal-Based Composite Coatings", China Surface Engineering, Issue No. 2005-01, Feb. 28, 2005, pp. 8-15, China.
English abstract for JP2007-64129.
English abstract for DE-19901770.

\* cited by examiner

ENGINE PISTON AND A PROCESS FOR MAKING AN ENGINE PISTON

CROSS-REFERENCE TO RELATED APPLICATIONS

This application claims priority to Brazilian Patent Application No. 102012022941-2, filed Sep. 11, 2012, and International Patent Application No. PCT/BR2013/000353, filed Sep. 11, 2013, both of which are hereby incorporated by reference in their entirety.

TECHNICAL FIELD

The present invention relates to an aluminum engine piston, particularly but not compulsorily a piston for use on engines that operate according to the Otto and Diesel cycles, wherein the formation of a metallic composite material in at least a part of the head or top region, obtained by friction of a non-consumable tool over a specially applied coating.

The present invention further relates to a process for making this engine piston.

BACKGROUND

Internal combustion engines employing pistons have one or more cylinders, inside which a piston makes an alternating movement. The piston compresses the air or air-fuel mixture (depending on the engine in question) and the piston head or top (its upper part) receives the direct impact of the explosion of the air-fuel mixture. In the case of engines that operate according to the Diesel cycle, the stress to which the piston top is subjected is even greater, given the high compression rations required for ignition of the air-fuel mixture.

At present, the more and more restrictive limits of consumption, emission of pollutants and noises to which the makers of vehicles such as automobiles, utility vehicles and heavy-duty commercial vehicles are subjected are leading to the need to design smaller and smaller and more economic engines, which are, however, capable of generating high torque and power values.

This is achieved by reducing the cubic capacity (piston displacement) of the engine (a concept called downsizing), coupled with the use of higher and higher overfeeding values (increase in turbo pressure) and the redesigning of the internal engine components. These new premises of design and operation generate a considerable increase in heat load on the piston heads, requiring the development of solutions that should guarantee high durability to the engine during its normal operation.

Besides the great stress to which a piston is subjected, due to the high compression ratios, an intrinsic characteristic of diesel engines is the existence of a specially designed recess at the piston top, which defines much of the volume of the combustion chamber.

These high thermal loads are especially critical in the border and bottom regions of the chamber, the recess being designed for enabling a greater combustion volume. And when they are made from light alloys such as aluminum alloys, the operation of the component may break by thermal fatigue these critical regions, may alter the explosion parameters and, in extreme cases, even interfere with the operation of the engine.

There are various ways to eliminate this drawback, by reinforcing the resistance of the piston head in the region of the combustion chamber, but none of them is as effective as the solution that was proposed by the applicant after long tests and studies.

Some solutions and are known at present and can be used for raising the resistance of the recess surface corresponding to the combustion chamber at the piston head.

Patent Document JP2007064129 relates to a process for making a piston groove more resistant by friction of a tool by relative rotational movement between the piston and the tool while the tool turns with respect to its own axis. The groove is formed in the friction area.

This document refers chiefly to the increase in resistance to wear caused by the rings on the piston groove. This improvement is achieved by friction of a non-consumable pin due to the refinement caused by intense friction, heat and plastic deformation of the material.

This prior art is important because it discloses that such a processing is already possible for piston aluminum allows, but it there is still no addition of any mechanical-reinforcement element, as required at the piston head.

The British Patent Document GB2367027 relates to an engine piston onto which a second material is applied over the piston base material. At least a part of the recess present at the piston head is formed, on part of which the second material is present. The region of the second material is formed on the piston base, where the friction heat is generated between both, plasticizing the material adjacent the tool. The continuous movement of the tool forms the second material and mixes it with the first material at the joining ends, keeping them joined together. In essence, this document refers simply to the welding of two different materials, even if they are of similar compositions, in order to form a piston head having greater strength. Even if the concept of composite is an alternative, the difference lies in the existence of a joint welded between different materials, not a modification of the substrate, as proposed by the applicant.

Patent Document WO2008/131273 discloses a cryogenic method for increasing the interface between metal and metal oxide particles, which can increase the efficiency of the exothermal reaction between these materials. One of the exothermal reactions described is $2Al_{(s)}+3CuO_{(s)} \rightarrow Al2O3_{(s)}+3Cu_{(s)}$, the other being $2Al_{(s)}+3Cu2O_{(s)} \rightarrow Al2O3_{(s)}+6Cu_{(s)}$. Whatever the reaction that takes place, it is followed by the complementary reaction $2Al_{(s)}+Cu_{(s)} \rightarrow Al_2Cu_{(s)}$.

European Patent Document EP0460901 relates to a method for obtaining a surface of metallic composite material on a convex surface like an engine piston. The method comprises rotating a non-consumable tool over a substrate containing a layer of hard ceramic particles, the friction and heat causing these particles to be incorporated into the substrate surface. This document, however, refers only to the incorporation of particles ex situ (previously sintered and deposited onto the surface), and does not make any mention of the presence of $Al_2Cu$ as a reinforcement element.

As one can see, none of the prior-art documents cited above discloses the solution developed by the applicant, which is an engine piston made of aluminum, improved by the fact that a pure-copper or oxidized coating is applied onto at least a part of its head or top, after which the non-consumable pin is rotated and concomitantly drawn over the copper-oxide coating, bringing about an exothermal reaction with the (aluminum-based) piston substrate, causing a homogeneous dispersion of fine and hard $Al_2Cu$ particles (theta phase) and $Al_2O_3$. In addition to the deposition, a great refinement of grains takes place, due to the resulting deformation and temperature.

Optionally, the processed substrate may be subjected to the forced cooling with liquid nitrogen, or a mixture of liquid nitrogen and methanol, or still other similar solutions, in order to obtain greater localized refinement of the substrate grains. Further, subsequent treatments of solubilization and precipitation are possible.

With regard to the prior art EP 0460901, the present invention has considerable differences, above all regarding the fact that the in situ particles existing therein have greater chemical compatibility with the substrate, are naturally smaller, without the need for intensive comminution (fragmentation). Since the synthesis takes place during the processing, there is no thermal dilation gradient between the particle and the matrix and, therefore, it provides greater loading of the particles and, as a result, lower strength performance.

SUMMARY

The present invention has the objective of providing an engine piston, particularly but not compulsorily a piston for use on engines that operate according to the Otto and Diesel cycles, wherein the formation of a metallic composite material occurs at least on part of the region of the piston head or top, obtained by friction of a non-consumable tool over a specially applied coating.

The present invention also relates to a process for making the engine piston aimed at, which is applied prior to the final machining of the component and that has the advantage of not causing thermal distortions.

The objectives of the present invention are achieved by means of an engine piston for use on internal combustion engines, provided with substantially circular aluminum-based body, defining a top portion that contains at least one cavity, wherein at least one coating layer is applied onto at least a part of the area defined by the top or cavity portion and at least one chemical compound is formed from the chemical reaction that takes place between the base material and the coating layer, due to the friction generated by the dragging movement of a non-consumable rotary pin with respect to the coating layer.

Optionally the process includes the following steps:
Step iii) forced cooling by liquid nitrogen, and
Step iv) thermal treatment of solubilization and/or precipitation.

BRIEF DESCRIPTION OF THE DRAWINGS

The present invention will now be described in greater detail with reference to an example of embodiment represented in the drawings. The figures show.

DETAILED DESCRIPTION

The present invention relates to an aluminum-based engine piston 1, on which the formation of a metallic composite material takes place at least on part of the region of piston head or top, obtained by friction of a non-consumable tool over a specially applied coating.

As mentioned before, at present the limits of consumption, emission of pollutant and noises to which the makers of vehicles such as automobiles, utility vehicles and heavy-duty commercial vehicles are subjected are more and more restrictive and are leading to the need to design smaller and smaller engines, which should be more economical but capable of generating high torque and power values (downsizing).

The present invention imparts to the piston, especially to the surface of the recess existing at its top, and to the cavity bottom that represents the combustion chamber greater strength resulting from the increase of particles resistant to fatigue and to the refinement of grains of the aluminum allow by which it is constituted.

First, it should be noted that the present piston may assume any necessary or desirable configuration as a function of the engine on which it will be employed. Thus, even if preferably the increase in resistance is necessary in pistons of Diesel engines that exhibit a recess at the piston had for defining the combustion chamber, it is evident that the present solution can be employed regardless of the specific shape of the piston top, which may be concave, convex, with a recess for opening the valves or still with any other design.

In the same way, the piston may be configured in such a way that the increase in resistance will be necessary not at specific portions of its top region, but at its skirt or in one or more grooves, in the orifice for positioning the piston, or still at any other necessary or desirable place.

Whatever the configuration of the piston 1, however, it should imperiously be formed of an aluminum alloy, in order for there to be reactions that will be described later.

Figure 1:
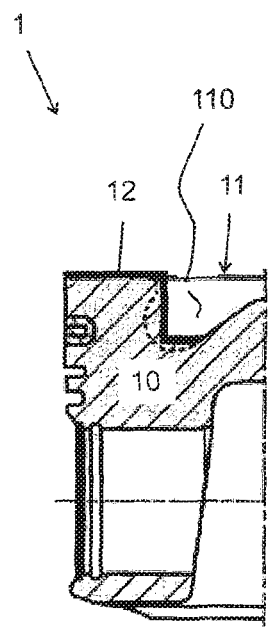
FIG. 1 is a cross-sectional view of the engine piston of the present invention after application of a copper-based coating and prior to the step of friction with the non-consumable pin.
Figure 2:
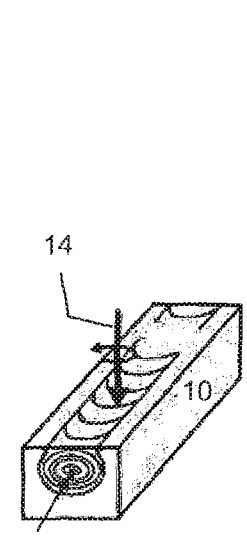
FIG. 2 is a schematic view of the non-consumable pin rotating around its own axis and being drawn with respect to the piston, under friction with the copper-based coating.
Figure 3:
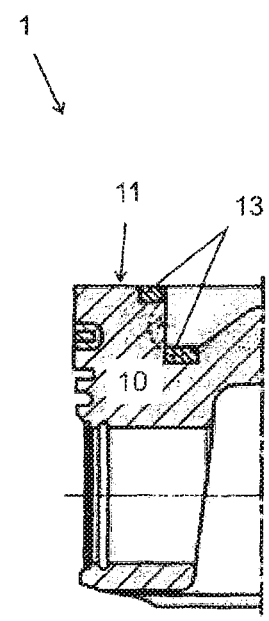
FIG. 3 is a cross-sectional view of the engine piston of the present invention after application of a copper-based coating and after the step of friction with the non-consumable pin.

A preferable non-limiting embodiment of the piston of the engine 1 of the present invention is disclosed in FIGS. 1 to 3 and refers to a piston of Diesel engine. The piston is provided with an aluminum-based body 10, which substantially defines a top portion 11 that represents a cavity 110 defining the combustion chamber.

Studies effected by the applicant have detected that, with the increase in power and torque generated by smaller and smaller engines, there is a growing overload on certain areas of the region that defines the combustion chamber, especially at the lowermost annular portion of the cavity and at its outer upper edge. As the engine is used, cracks in these regions tend to occur, which diminish the useful life of the piston and, in some cases, obliges one to replace the piston and other engine components.

So, the piston 1 of the present invention receives application of at least one coating layer 12 in at least a part of the area defined by the top portion 11.

In the preferred embodiment illustrated in the figures, one applies a coating layer 12 of pure or oxidized copper at least in the lowermost annular portion of the cavity provided at the piston top and at its outer upper edge, since these regions are more susceptible to wear, but it is evident that one or more layers may be applied in other parts of the piston, if necessary or desirable.

It is important to note further that the coating layer 12 may be formed not only by pure or oxidized copper, but also by a layer composed of aluminum and alumina, or aluminum and boron carbonitride, or still aluminum and carbon nanotubes and may be applied/deposited by any process known to those skilled in the art, as for instance electrodeposition, spraying of powders, wires or solutions, either hot or cold, or still any other process.

Back to the description of the piston 1, a non-consumable rotary dragging pin 14, is rubbed against the piston in at least a part of the region in which the coating layer 12 has been applied. The dragging pin 14 turns about its own axis and moves with respect to the piston in a friction situation that generates heat (see schematic simulation in FIG. 2). Thus, at least one chemical compound 13 is formed from the chemical reaction that takes place between the base material and the coating layer 12 due to the friction generated by the dragging movement of a non-consumable rotary pin 14 with respect to the coating layer 12.

Describing in greater detail, the heat released brings about a chemical reaction between the elements of the coating layer 12 and the base metal (aluminum) of the piston, creating a new substance that exhibits greater strength. Additionally, the heat and the deformation resulting from the friction between the pin 14 and the coating 12 causes refinement of the aluminum-and-silicon grains present in the piston base allow.

It should be noted that the pin 14 is of the non-consumable type, because its structure does not alter with the temperature and it does not exchange material with the piston because of the heat. There is no deposition of external material (ex situ) onto the coating and piston base due to the friction generated by the pin 14. The chemical reactions take place only between the piston elements and the coating (in situ), and as a result of heating. The in situ particles existing in the piston have the potential of being smaller and more compatible with the material, which means better cohesion and non-degradation, among others.

In this preferable embodiment of the piston 1 illustrated in the figures, the heat from friction of the pin 14 with respect to the coating 12 causes the chemical reactions indicated below, but it is evident that they may vary as a function of the coating 12 used:

$$2Al_{(s)} + 3CuO_{(s)} \rightarrow Al_2O_{3(s)} + 3Cu°$$

$$2Al_{(S)} + 3Cu_2O_{(s)} \rightarrow Al_2O_{3(s)} + 6Cu°$$

Two reactions are possible in this first step, depending of the oxidation of the layer deposited and the thermal energy which one desires to release.

Then, whatever reaction takes place, it will be followed by the following complementary reaction:

$$2Al° + Cu° \rightarrow Al_2Cu_{(s)}$$

The formation of $Al_2O_{3(s)}$ and $Al_2Cu_{(s)}$ (teta) imparts to the regions where they are present greater strength, which, coupled to the refinement of the aluminum and silicon grains present in the base alloy of the piston, make the part quite more resistant to wear.

Alternatively, if necessary or desirable, the coating layer 12 and the dragging pin 14 are such that the heat from friction of the pin 14 with the coating 12 causes the formation of trivalent chrome oxide ($Cr_2O_3$).

After application of the rotary pin, the piston may or may not undergo any other type of operation, such as forced cooling and thermal treatment of solubilization and/or precipitation. In the preferred embodiment illustrated in the figures, the generation of the new materials takes place prior to the last operation of machining the cavity referring to the combustion chamber. This machining removes rest from the coating layer 12, which are affected by the heat from friction of the pin 14.

The control of the pin compression force, rotation thereof and velocity of its draw with respect to the coating layer determine the thickness or depth of the layer of the new compound 13 in the regions where it has been created. In the case of the presently illustrated piston, the thickness of the layer 13 is of about 6 millimeters, but it is evident that it may vary without the resulting piston failing to be included in the protection scope of the accompanying claims.

The piston 1 of the present invention exhibits an innovatory technique for creating compound that are more resistant to heat fatigue on an aluminum-based piston, thus being novel and provided with inventive activity over the prior techniques.

A process for making the piston of the present invention is also a novel and inventive invention.

In essence, this is an engine piston for use on internal combustion engines, provided with a substantially circular aluminum-based body that defines a top portion, characterized by comprising the following steps:

Step i) application of a coating layer 12 onto at least a part of the area defined by the top portion 11, and Step ii) formation of at least one chemical compound 13 from the chemical reaction that takes place between the base material and the coating layer 12 due to the friction generated by the dragging movement of a non-consumable dragging pin 14 with respect to the coating layer 12.

The step (i) comprises application of the coating layer 12 by the processes of electrodeposition, spaying of powders, wires or solutions, either hot or cold (electroplating, thermal spray or cold spray).

A preferred example of embodiment having been described, one should understand that the scope of the present invention embraces other possible variations, being limited only by the contents of the accompanying claims, which include the possible equivalents.

The invention claimed is:

1. A piston for an internal combustion engine, comprising: a substantially circular body composed of an aluminum containing base material defining a top portion having at least one cavity, and at least one coating layer disposed on at least one area defined by at least one of the top portion and the at least one cavity, wherein the at least one coating layer includes at least one chemical compound derived from a chemical reaction between the base material of the body and the at least one coating layer in response to friction generated by a dragging movement of a non-consumable rotary pin on the at least one coating layer.

2. The piston according to claim 1, wherein the at least one coating layer is composed of at least one of a pure copper, an oxidized copper, Al+SiC, Al+Al$_2$O$_3$, Al+BCN and aluminum carbon nanotubes.

3. The piston according to claim 1, wherein the at least one coating layer is composed of a trivalent chrome oxide.

4. The piston according to claim 2, wherein the at least one chemical compound is Al$_2$Cu$_{(s)}$.

5. The piston according to claim 2, wherein the coating layer includes at least two chemical compounds derived from the chemical reaction between the base material and the at least one coating layer, the at least two chemical compounds including Al$_2$O$_3$(s) and Cu°.

6. The piston according to claim 2, wherein the at least one coating layer is disposed on the at least one area via at least one of a electrodeposition process, a powder spaying process, a wire spraying process, a hot spraying process and a cold spraying process.

7. The piston according to claim 3, wherein the at least one chemical compound is Al$_2$Cu$_{(s)}$.

8. The piston according to claim 1, wherein the at least one chemical compound is Al$_2$Cu$_{(s)}$.

9. The piston according to claim 8, wherein the at least one coating layer is composed of at least one of pure copper, oxidized copper, aluminum and alumina, aluminum and boron carbonitride, and aluminum and carbon nanotubes.

10. The piston according to claim 1, wherein the coating layer includes at least two chemical compounds derived from the chemical reaction between the base material and the at least one coating layer, the at least two chemical compounds including $Al_2O_3(s)$ and $Cu°$.

11. The piston according to claim 10, wherein the at least one coating layer is composed of at least one of pure copper, oxidized copper, aluminum and alumina, aluminum and boron carbonitride, and aluminum and carbon nanotubes.

12. The piston according to claim 10, wherein the at least one coating layer is composed of a trivalent chrome oxide.

13. The piston according to claim 1, wherein the at least one chemical compound is $Cr_2O_3$.

14. A process for producing an engine piston of an internal combustion engine, comprising:
    providing a substantially circular body composed of an aluminum base material defining a top portion,
    applying a coating layer onto at least one area defined by the top portion, and
    forming at least one chemical compound in the coating layer via a chemical reaction between the base material and the coating layer, wherein the chemical reaction is activated by friction generated from dragging a non-consumable rotary pin on the coating layer.

15. The process according to claim 14, wherein applying the coating layer includes at least one of an electrodeposition process, a powder spraying process, a wire spraying process, an electroplating process, a hot spraying process and a cold spraying process.

16. The process according to claim 14, further comprising the following steps:
    cooling the coating layer via a liquid nitrogen; and
    treating the coating layer via a thermal treatment of at least one of solubilization and precipitation.

17. The process according to claim 14, wherein the coating layer is composed of at least one of pure copper, oxidized copper, aluminum and alumina, aluminum and boron carbonitride, and aluminum and carbon nanotubes.

18. The process according to claim 14, wherein the coating layer is composed of a trivalent chrome oxide.

19. The process according to claim 14, wherein the at least one chemical compound includes at least one of $Al_2Cu_{(s)}$, $Al_2O_3$ and $Cu°$.

20. A piston for an internal combustion engine, comprising:
    a body composed of an aluminum base material, the body including a top portion having an upper surface and an annular cavity;
    at least one coating layer disposed at least partially on the upper surface and the cavity of the top portion, the at least one coating layer composed of at least one of pure copper, oxidized copper, aluminum, alumina, boron carbonitride and carbon nanotubes;
    wherein the at least one coating layer includes a dispersion of at least two chemical compounds derived from a chemical reaction between the aluminum base material and the at least one coating layer in response to friction generated via a relative dragging movement of a non-consumable rotary pin on the at least one coating layer, wherein the at least two chemical compounds respectively include at least one of $Al_2Cu_{(s)}$, $Al_2O_3$, $Cu°$ and $Cr_2O_3$.

* * * * *

UNITED STATES PATENT AND TRADEMARK OFFICE
CERTIFICATE OF CORRECTION

PATENT NO. : 9,611,803 B2  
APPLICATION NO. : 14/427307  
DATED : April 4, 2017  
INVENTOR(S) : Paulo R. Vieira De Morais et al.

Page 1 of 1

It is certified that error appears in the above-identified patent and that said Letters Patent is hereby corrected as shown below:

On the Title Page

Foreign Application Priority Data, please correct the following priority data to the following:
"September 11, 2012 (BR) .............................. 102012022941 2"

Signed and Sealed this  
First Day of August, 2017

Joseph Matal  
*Performing the Functions and Duties of the*  
*Under Secretary of Commerce for Intellectual Property and*  
*Director of the United States Patent and Trademark Office*